United States Patent [19]
Devlin et al.

[11] Patent Number: 6,037,016
[45] Date of Patent: Mar. 14, 2000

[54] CAPACITIVELY COUPLED RF DIAMOND-LIKE-CARBON REACTOR

[75] Inventors: David James Devlin, Los Alamos; Don Mayo Coates, Santa Fe; Thomas Arthur Archuleta, Espanola; Robert Steven Barbero, Santa Cruz, all of N. Mex.

[73] Assignees: E.I. du Pont de Nemours and Company, Wilmington, Del.; Regents of the University of California, Oakland, Calif.

[21] Appl. No.: 09/077,513

[22] PCT Filed: Nov. 18, 1996

[86] PCT No.: PCT/US96/18438

§ 371 Date: May 29, 1998

§ 102(e) Date: May 29, 1998

[87] PCT Pub. No.: WO97/20981

PCT Pub. Date: Jun. 12, 1997

Related U.S. Application Data

[60] Provisional application No. 60/007,848, Dec. 1, 1995.

[51] Int. Cl.⁷ .......................... D06M 11/74; C23C 16/00; B05D 3/06
[52] U.S. Cl. .................. 427/577; 427/249.3; 427/249.7; 427/904; 118/723 E
[58] Field of Search ................................. 427/577, 249.7, 427/249.3, 902, 904, 255.5; 118/723 E

[56] References Cited

U.S. PATENT DOCUMENTS

| | | | |
|---|---|---|---|
| 4,048,953 | 9/1977 | Froberg | 118/49 |
| 5,431,968 | 7/1995 | Miller et al. | 427/577 |

FOREIGN PATENT DOCUMENTS

| | | |
|---|---|---|
| 0 359 567 A2 | 3/1990 | European Pat. Off. . |
| 3-158468 | 7/1991 | Japan . |
| 2 287 473 | 9/1995 | United Kingdom . |
| WO 95/26879 | 10/1995 | WIPO . |

OTHER PUBLICATIONS

Iqbal S. Athwal, et al., "DLC Films By Plasma Assisted Chemical Vapor Deposition Near Room Temperature", *Diamond and Related Materials*, vol. 2, No. 12, 1483–1489, Nov. 1, 1993.

S. R. P. Silva, et al., "Diamond–Like Carbon Thin Film Deposition Using A Magnetically Confined r.f. PECVD System", *Diamond and Related Materials*, vol. 4, No. 7, 977–983, May 15, 1995.

David J. Devlin, et al., "Diamond Like Carbon Coated "Kevlar" for Improved Mechanical Properties", *Electrochemical Society Proceedings*, vol. 96, No. 5, 691–698, 1996 No month data!.

B. R. Mehta, et al., "Room–Temperature Deposition of Diamond–Like Carbon Films By The Microwave Plasma Jet Method", *Diamond and Related Materials*, vol. 3, No. 1/02, 10–13, Jan. 1, 1994.

F. J. McGarry, et al., "Ceramic Coated Rigid Rod Polymer Fibers", *SAMPE Quarterly*, 35–38, Jul., 1992.

Database WPI, "Semiconductor Energy Lab", Derwent Publications Ltd., London, Abstract, Jul. 8, 1991.

*Primary Examiner*—Roy V. King

[57] ABSTRACT

A process of coating a non-conductive fiber with diamond-like carbon, including passing a non-conductive fiber between a pair of parallel metal grids within a reaction chamber, introducing a hydrocarbon gas into the reaction chamber, forming a plasma within the reaction chamber for a sufficient period of time whereby diamond-like carbon is formed upon the non-conductive fiber, is provided together with a reactor chamber for deposition of diamond-like carbon upon a non-conductive fiber, including a vacuum chamber, a cathode assembly including a pair of electrically isolated opposingly parallel metal grids spaced apart at a distance of less than about 1 centimeter, an anode, a means of introducing a hydrocarbon gas into said vacuum chamber, and a means of generating a plasma within said vacuum chamber.

7 Claims, 1 Drawing Sheet

CAPACITIVELY COUPLED RF DIAMOND-LIKE-CARBON REACTOR

CROSS-REFERENCE TO RELATED APPLICATIONS

This application claims the benefit of U.S. Provisional Application 60/007,848, filed Dec. 1, 1995 and PCT International Application PCT/US96/18438, filed Nov. 18, 1996, wherein the United States was a designated country.

FIELD OF THE INVENTION

The present invention relates to an apparatus for the coating of non-conductive fibers with diamond-like-carbon and to a process for the coating of non-conductive fibers with diamond-like-carbon. This invention is the result of a contract with the United States Department of Energy (Contract No. W-7405-ENG-36).

BACKGROUND OF THE INVENTION

Since at least the early 1960's, liquid crystalline polymers have been used to produce high strength fibers. Well known examples of these types of fibers include aramid fibers made from highly-oriented rod4ike polymers of poly (paraphenylene terephthalamide), well known as KEVLAR® aramid fibers commercially available from E. I. du Pont de Nemours and Company, Wilmington, Del. or Twaron fibers, commercially available from Akzo Nobel NV, Netherlands. These aramid fibers provide exceptional tenacity and a high tensile modulus. Breaking strengths of 2.3–3.4 gigapascals (GPa) with a modulus of 55–143 GPa are typical for these fibers. This, combined with their low specific gravity and thermal stability, has resulted in improved performance in many structural applications such as aircraft, boats, sporting goods, missiles and armor. However, a major drawback of these types of fibers has been their relatively poor flexural rigidity and compressive properties. Fibers yield at low values of stress on the order of 400 megapascals (MPa) with the formation of kink bands.

In order to alleviate this difficulty, much effort has gone into attempts to cross-link the polymer in the filaments, but to date there has been little success. Another approach has been to coat the fiber with a sufficiently high modulus material, to, in effect, "girdle" the filament and prevent buckling. Early work by McGarry et al., SAMPE Quarterly, p. 35, July 1992, demonstrated the effectiveness of this approach with vapor deposited alumina coatings. Recently, enhanced properties have been reported for the microwave plasma assisted organometaUic deposition of TiN coatings on KEVLAR® aramid fibers.

An alternative coating for KEVLAR® aramid fibers with potential for improving the mechanical properties of the fibers is "diamond-like-carbon" (DLC). DLC is a smooth amorphous solid made up of a highly cross-linked carbon network with a substantial degree of $sp^3$ bonding. This $sp^3$ bonding results in mechanical properties approaching that of diamond itself. The fraction of $sp^3$ bonding can vary from about 10 percent to about 90 percent depending upon the deposition process and the processing conditions, yielding films with properties ranging from polymer-like to diamond-like. Typical values of modulus for hard coatings are in the range of 20 to 177 GPa. This, combined with low density, low coefficient of friction, high hardness and low deposition temperatures, makes for ideal material for coating aramid fibers.

Yet, the coating of non-conductive materials such as aramids is not straightforward. Previously, the deposition of diamond-like carbon onto KEVLAR® aramid fibers has been accomplished by initially pre-coating the fiber with a thin nickel layer to confer conductivity. It is desirable to coat the non-conductive fiber, e.g., the KEVLAR® aramid fiber, without the need for any intermediate metal layer.

It is an object of the present invention to provide an apparatus for coating a non-conductive fiber, especially an aramid fiber, such as KEVLAR® aramid fiber, with diamond-like-carbon.

It is a further object of the invention to provide a process for coating a non-conductive fiber, especially an aramid fiber, such as KEVLAR® aramid fiber, with diamond-like carbon. Other objects and advantages of the present invention will become apparent to those skilled in the art upon reference to the attached figures and to the detailed description of the invention which hereinafter follows.

SUMMARY OF THE INVENTION

To achieve the foregoing and other objects, and in accordance with the purposes of the present invention, as embodied and broadly described herein, the present invention provides a process of coating a non-conductive fiber with diamond-like carbon including passing a non-conductive fiber between a pair of parallel metal grids within a reaction chamber, introducing a hydrocarbon gas into the reaction chamber, forming a plasma within the reaction chamber for a sufficient period of time whereby diamond-like carbon is formed upon the non-conductive fiber.

The present invention further provides a reactor chamber for deposition of diamond-like carbon upon a non-conductive fiber including a vacuum chamber, a cathode assembly including a pair of electrically isolated opposingly parallel metal grids spaced apart at a distance of less than about 1 centimeter, an anode, a means of introducing a hydrocarbon gas into said vacuum chamber, and a means of generating a plasma within said vacuum chamber.

The present invention still further provides a cathode assembly including a pair of electrically isolated opposingly parallel metal grids spaced apart at a distance of less than about 1 centimeter sufficient to substantially eliminate formation of a plasma within the space between the parallel metal grids.

DETAILED DESCRIPTION

The present invention is concerned with the deposition of DLC onto non-conductive fibers including an apparatus for the deposition of DLC onto non-conductive fibers and a process for the deposition of DLC onto non-conductive fibers.

As used herein, diamond-like-carbon or DLC means carbon with an appropriate short range order, i.e., an ordered arrangement of atoms less than about 10 nanometers (nm) in any direction.

Among the non-conductive fibers that can be coated by the DLC are included fibers of organic polymers, such as poly(para-phenylene terephthalamide), or fibers of inorganic polymers or materials such as silicon carbide. Other non-conductive polymer fibers, such as nylon, other liquid crystalline polymers, or NOMEX® aramid fibers (commercially available from E. I. du Pont de Nemours and Company, Wilmington, Del.), or other non-conductive inorganic fibers, such as alumina-based fibers or glass fibers, can be similarly coated.

The fibers coated by DLC in the present process and apparatus are generally of a thickness from about 0.1 microns to about 10 microns, preferably from about 0.1 microns to about 2 microns.

The cathode assembly of the present invention includes a pair of metal, e.g., steel, plates, each having a center section removed from the plate. Over this center section of each plate is mounted a metal grid or mesh having square or diamond-shaped openings. The metal grid or mesh is preferably oriented such that the metal portion of the grid is not parallel to the direction of fiber alignment during deposition thereby avoiding any potential continuous shading of the underlying fiber.

Figure 1:
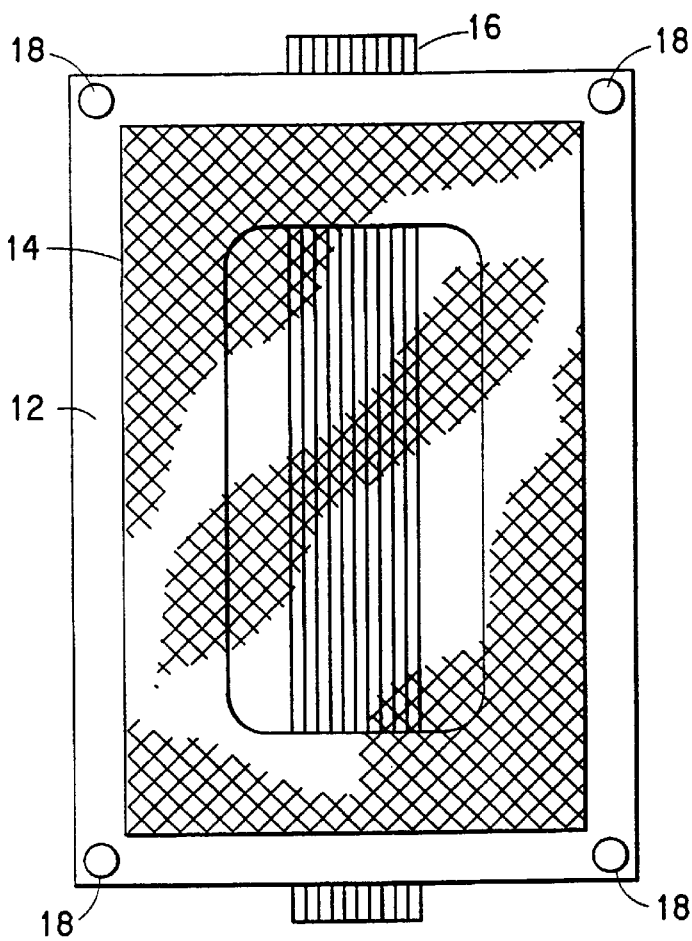
FIG. 1 is a side view of the cathode assembly in accordance with the present invention.

The cathode assembly is shown in FIG. 1 and includes a first plate 12 positioned within a parallel plane over a second plate 13 (not shown). Both the first plate 12 and the second plate have a center opening over which is positioned a metal grid or mesh 14. The metal grid or mesh 14 is shown with the openings defining a square or diamond shape and the metal of the grid is positioned so as to not be parallel with the underlying fiber spread 16. The plates are joined by a suitable attachment means shown at 18.

Figure 2:
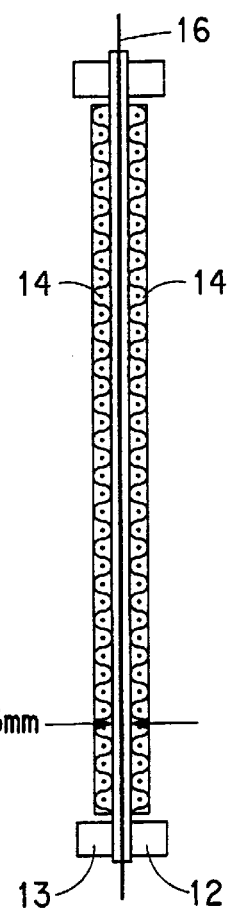
FIG. 2 is a second side view of the cathode assembly in accordance with the present invention.

FIG. 2 shows a second side view of the assembly shown in FIG. 1 and includes the first plate 12 and the second plate 13, the metal grids or meshs 14, and the underlying fiber spread 16. The first plate 12 and the second plate 13 are separated by appropriate non-conductive spacers, such as alumina spacers, and the metal grids or meshs 14 are spaced apart at dimensions suitable to avoid the formation of any plasma between the grids. Typically, this spacing between grids is maintained at less than about one centimeter, preferably from about 0.1 millimeter to about 10 millimeters, and more preferably from about 1 millimeter to about 3 millimeters.

The reactor assembly for the present invention includes the cathode assembly (previously described) mounted within a suitable high vacuum chamber. The vacuum chamber should be capable of maintaining reduced pressures of from about $10^{-5}$ to about $10^{-6}$ torr. The vacuum system should further include a means for introducing a hydrocarbon gas into the chamber such as a gas inlet. Further, the vacuum system should include the necessary means of generating a plasma from the hydrocarbon gas within the vacuum chamber such as suitable electrical connections to power the cathode assembly which, in combination with a grounded anode, will result in a negative DC bias at the cathode. Generally, the bias potential is maintained at from about 100 to about 1000 volts. Higher bias potentials can result in the formation of products other than DLC such as glassy carbon or graphitic carbon.

To form the plasma for formation of the DLC in the present process, hydrocarbon gases such as alkanes (methane, ethane, propane, butane and the like), alkenes (ethene, propene, butene, pentene and the like), alkynes (acetylene, propyne, butyne, pentyne and the like) or other hydrocarbons such as alkadienes, alkatrienes, cycloalkanes, arenes, cumulenes, terpenes and the like can be employed. Preferable, the hydrocarbon gas is an alkane such as methane.

The reactor assembly can further include a means for transporting fiber through the chamber for efficient and continuous processing of the fiber. Such a means for transporting the fiber can involve a pair of spools or reels situated on opposite sides of the reaction chamber within the vacuum system such that the fiber to be coated is unwound off of a first spool, passed through the reaction chamber and through the cathode assembly for coating with DLC and then rewound as a coated fiber on a second spool.

In operation of the reaction system, the hydrocarbon gas is introduced into the reaction chamber, the cathode is appropriately biased versus the anode and the cathode is subjected to radio frequency (RF) energy at about 13.56 Mhz to generate the plasma. Other frequencies may be also employed or the plasma may be generated by DC applied to the cathode assembly. As the plasma is generated and the hydrocarbon gas is ionized, ions are preferentially attracted and accelerated towards the cathode due to the self bias.

To improve adhesion of the coating to the fibers, an argon etching process using the same experimental configuration was employed prior to deposition. In one embodiment, after the initial DLC deposition was complete, the plate on which the fibers were mounted were turned over and the other side of the fibers were coated using the same procedure. Well adhered coatings of DLC up to about two microns thick were obtained with this procedure.

Unlike conventional thermal chemical vapor deposition (CVD), the ion bombardment aspect of the process results in line of sight deposition. Conformal coating is possible by careful design of the anode/cathode assembly. To fully coat around the fibers, deposition was performed on spread fiber tows and coated one side at a time.

The present invention is more particularly described in the following non-limiting examples which are intended as illustrative only, since numerous modifications and variations will be apparent to those skilled in the art.

EXAMPLE 1

KEVLAR® 49 aramid fibers from E. I. du Pont de Nemours and Company (Wilmington, Del.) were coated using a parallel plate 13.56 megahertz (MHz) RF plasma technique as shown in FIG. 1. The system consisted of a diffusion pumped high vacuum chamber with mass flow controllers and a conductance valve for operation at reduced pressure. The basic process required the formation of a plasma between a grounded anode (the wall of the vacuum system) and a powered cathode. The anode-cathode assembly was deliberately asymmetrical such that a negative DC self-bias resulted at the cathode. The plasma was formed from a hydrocarbon gas of methane, which was disassociated and ionized in the plasma. Ions were accelerated across the plasma sheath towards the cathode as a result of the self biasing. Ion bombardment was a critical aspect of depositing DLC with the desired properties. For a pressure regime of 50 to 100 microns, biasing on the order of several 100 volts to about 1000 volts was required. Low bias potentials result in polymer-like properties while too high of a potential will yield a glassy or graphitic carbon film.

A portion of the fiber bundles, 5 cm in length, was cut from the tow and ⅔ of the fiber bundle removed. The remainder of the bundle was spread by hand and mounted on a steel plate approximately 10 cm by 13 cm with a center section of dimensions 2.5 cm by 5 cm removed. The fibers were held to the plate with welded metal clips. The plate with fibers was mounted to a second "cathode plate" and electrically isolated from the cathode plate with alumina spacers. This assembly was placed in a vacuum system and isolated from ground. The cathode plate was electrically connected to a power output of a matching network which was in turn connected to an RF, 13.56 Mhz power supply.

The vacuum chamber was evacuated to a base pressure of $10^{-6}$ torr and backfilled with argon to a pressure of $3.5 \times 10^{-5}$ torr. Sixty-five watts of RF power was applied to the cathode resulting in a negative self-bias of approximately −500 volts DC. These conditions were used to sputter clean the fiber surface for a period of 15 minutes and improve film adhesion. Following this argon pretreatment, the RF power and argon was turned off and the system was evacuated to $10^{-6}$ torr. Methane gas was introduced to a pressure of $8.5 \times 10^{-5}$. Sixty-five watts of RF power was applied to the cathode resulting in a negative self-bias of approximately 520 volts DC. Deposition was continued for about 4 hours. At the end of this time both the RF power and methane gas flow were discontinued and the chamber re-evacuated. The sample was allowed to cool. The chamber was backfilled with argon and opened to air. The stainless steel plate was removed from the cathode, turned over and refixtured to the cathode for coating the opposite side of the fibers. The chamber was evacuated as before and methane gas was introduced to a pressure of $8.5 \times 10^{-5}$. Sixty-five watts of RB power was applied to the cathode resulting in a negative self bias of approximately 475 volts DC. Deposition was continued for an additional 4 hours.

Figure 3:
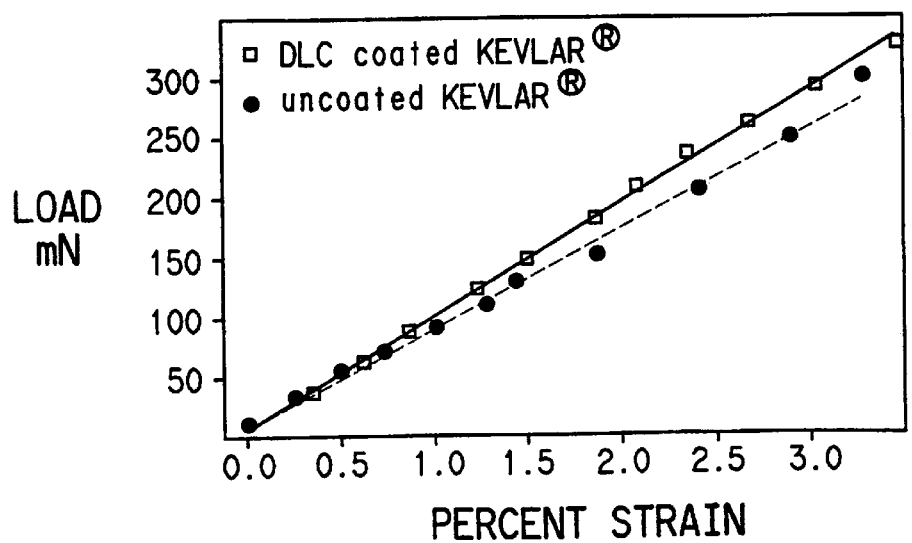
FIG. 3 is a graph showing the results of a three point bend test on coated and uncoated KEVLAR® aramid fibers.

The resultant material, i.e., the coated fibers, was tested using a three point bend test developed for use with a nanoindentor from Nano Instruments, Inc. (Knoxville, Tenn.) and described in U.S. provisional patent application serial number 60/007,849, by Devlin et al., entitled "Flexure Test For Small Diameter Fibers", filed concurrently herewith, the contents of which are incorporated herein by reference. The results of the test are shown in FIG. 3.

EXAMPLE 2

As a goal to continuously and efficiently coat fibers, a process for coating both sides of the fiber simultaneously was devised. The process is illustrated in FIG. 1. The cathode assembly consisted of two parallel grids constructed from stainless steel mesh. The grids were spaced about 3 millimeters (mm) apart and form the cathode assembly. The non-conducting fibers (i.e., the KEVLAR® 49 aramid fibers of Example 1) were passed between the grids, and ions were accelerated through the grid from both directions striking both sides of the fibers essentially simultaneously. By maintaining the grid spacing to less than the cathode dark space, on the order of about one centimeter (cm), the formation of a plasma between the grids was avoided. While only static runs were performed, in a preferred practice, the fiber or fibers would be continuously transported between the rids resulting in uniform coatings on both sides. Similar conditions and pretreatment to those previously described in Example 1 were used. Uniform coating up to 0.1 microns were obtained. For thicker coatings, shadow effects from the grid were observed. In a continuous system, shadowing would not be present.

Sixteen KEVLAR® 49 aramid fibers were spread by hand and taped across the open section of a steel plate 1.5 millimeters thick. A second plate identical to the first was attached such that the fibers were sandwiched between them but visible from both sides through the openings. Stainless steel mesh was attached to both plates covering the openings. This entire assembly served as the cathode. A 3 mm spacing between the steel mesh grids met the requirements necessary to avoid ionization between the grids while ions formed external to the cathode assembly were accelerated across the dark space on both sides of the assembly due to the self-bias and passed through the grids to strike the fibers from both sides. The nonconducting fibers were then held between the grids as ions were accelerated through the grid from two directions to strike the fibers.

EXAMPLE 3

The fibers were continuously transported between the grid (assembled as in Example 2) resulting in uniform coatings on both sides. Continuous coating avoided shadow effects from the grid forming in the coating.

Although the present invention has been described with reference to specific details, it is not intended that such details should be regarded as limitations upon the scope of the invention, except as and to the extent that they are included in the accompanying claims.

What is claimed is:

1. A process of coating a non-conductive fiber with diamond-like carbon comprising:

passing the non-conductive fiber between a pair of electrically isolated opposingly parallel metal grids spaced apart at a distance of less than about 1 centimeter within a reaction chamber;

introducing a hydrocarbon gas into the reaction chamber;

forming a plasma within the reaction chamber for a sufficient period of time whereby the diamond-like-carbon is formed directly upon the surface of the non-conductive fiber.

2. The process of claim 1 wherein said non-conductive fiber is an organic polymer fiber.

3. The process of claim 2 wherein said non-conductive organic polymer fiber is comprised of poly(para-phenylene) terephthalamide.

4. A cathode assembly including a pair of electrically isolated opposingly parallel metal grids spaced apart at a distance of less than about 1 centimeter sufficient to substantially eliminate formation of a plasma within the space between the parallel metal grids.

5. A reactor chamber for deposition of diamond-like-carbon upon a non-conductive fiber comprising:

a vacuum chamber;

a cathode assembly including a pair of electrically isolated opposingly parallel metal grids spaced apart at a distance of less than about 1 centimeter;

an anode;

a means of introducing a hydrocarbon gas into said vacuum chamber; and a means of generating a plasma within said vacuum chamber.

6. The reactor chamber of claim 5 further including a means of continuously passing the non-conductive fiber through said cathode assembly.

7. The reactor chamber of claim 5 wherein said non-conductive fiber is comprised of poly(para-phenylene) terephthalamide.

* * * * *